United States Patent
Okamoto et al.

(10) Patent No.: US 10,373,732 B2
(45) Date of Patent: Aug. 6, 2019

(54) TRANSPARENT ELECTRODE FILM, DIMMING ELEMENT, AND METHOD FOR MANUFACTURING TRANSPARENT ELECTRODE FILM

(71) Applicant: Kaneka Corporation, Osaka (JP)

(72) Inventors: Shimpei Okamoto, Osaka (JP); Junichi Nakamura, Osaka (JP); Yuji Takahashi, Osaka (JP); Takahisa Fujimoto, Osaka (JP); Takayoshi Kushizaki, Osaka (JP); Hitoshi Tamai, Osaka (JP)

(73) Assignee: Kaneka Corporation (JP)

( * ) Notice: Subject to any disclaimer, the term of this patent is extended or adjusted under 35 U.S.C. 154(b) by 0 days.

(21) Appl. No.: 15/741,853

(22) PCT Filed: Jul. 13, 2016

(86) PCT No.: PCT/JP2016/070707
§ 371 (c)(1),
(2) Date: Jan. 4, 2018

(87) PCT Pub. No.: WO2017/010521
PCT Pub. Date: Jan. 19, 2017

(65) Prior Publication Data
US 2018/0204651 A1    Jul. 19, 2018

(30) Foreign Application Priority Data

Jul. 16, 2015 (JP) .................................. 2015-142405

(51) Int. Cl.
*H01B 5/14* (2006.01)
*B32B 7/02* (2019.01)
(Continued)

(52) U.S. Cl.
CPC ................. *H01B 5/14* (2013.01); *B32B 7/02* (2013.01); *G02F 1/13439* (2013.01);
(Continued)

(58) Field of Classification Search
CPC ... G02F 1/01; G02F 1/167; G02F 1/19; E06B 9/24; E06B 2009/2464
(Continued)

(56) References Cited

U.S. PATENT DOCUMENTS

2007/0063156 A1* 3/2007 Hayashi ................ H01L 51/424
250/559.07
2015/0014030 A1   1/2015 Mitamura et al.
(Continued)

FOREIGN PATENT DOCUMENTS

JP   2008107549 A   5/2008
JP   2011077068 A   4/2011
(Continued)

OTHER PUBLICATIONS

International Preliminary Report on Patentability corresponding to PCT/JP2016/070707, dated Jan. 25, 2018, 10 pgs.
(Continued)

*Primary Examiner* — Mohammed A Hasan
(74) *Attorney, Agent, or Firm* — Lerner, David, Littenberg, Krumholz & Mentlik, LLP (57) ABSTRACT

A transparent electrode film includes a transparent electrode disposed on a transparent film base, wherein the transparent electrode contains a transparent conductive layer and a conductive metal pattern layer. The conductive metal pattern layer is patterned in the in-plane direction of the transparent film base. The transparent conductive layer and a protecting layer are disposed in a region where the conductive metal pattern layer is provided, and the conductive metal pattern layer is disposed closer to the transparent film base than the
(Continued)

transparent conductive layer and the protecting layer. The protecting layer includes at least one selected from the group consisting of a precious metal and a metal oxide. The transparent electroconductive layer is also disposed at opening sections where the electroconductive metal pattern layer is absent.

15 Claims, 5 Drawing Sheets

(51) Int. Cl.
      *G02F 1/1343*     (2006.01)
      *G02F 1/155*      (2006.01)
      *G02F 1/167*      (2019.01)
      *H01B 1/08*       (2006.01)
      *H01L 51/52*      (2006.01)

(52) U.S. Cl.
      CPC .............. *G02F 1/155* (2013.01); *G02F 1/167* (2013.01); *H01B 1/08* (2013.01); *H01L 51/5215* (2013.01); *H01L 51/5234* (2013.01); *H01L 2251/308* (2013.01)

(58) Field of Classification Search
      USPC ........................................................ 359/238
      See application file for complete search history.

(56) References Cited

U.S. PATENT DOCUMENTS

| | | | |
|---|---|---|---|
| 2015/0226512 A1* | 8/2015 | Butsook | F41B 5/143 |
| | | | 124/20.3 |
| 2016/0011351 A1* | 1/2016 | Tomohisa | G02B 5/1861 |
| | | | 359/488.01 |
| 2016/0062510 A1 | 3/2016 | Tomohisa et al. | |
| 2016/0152002 A1* | 6/2016 | Inui | B32B 7/02 |
| | | | 428/172 |

FOREIGN PATENT DOCUMENTS

| | | |
|---|---|---|
| JP | 2011124075 A | 6/2011 |
| JP | 2013224397 A | 10/2013 |
| JP | 2014044934 A | 3/2014 |
| JP | 2014072041 A | 4/2014 |
| JP | 2014197183 A | 10/2014 |
| JP | 2014219667 A | 11/2014 |
| KR | 1020100135126 A | 12/2010 |

OTHER PUBLICATIONS

International Search Report for Application No. PCT/JP2016/070707, dated Oct. 18, 2016.

\* cited by examiner

FIG. 8

TRANSPARENT ELECTRODE FILM, DIMMING ELEMENT, AND METHOD FOR MANUFACTURING TRANSPARENT ELECTRODE FILM

CROSS-REFERENCE TO RELATED APPLICATION

This application is a national phase entry under 35 U.S.C. § 371 of International Application No. PCT/JP2016/070707, filed on Jul. 13, 2016, published in Japanese, which claims priority to Japanese Patent Application No. 2015-142405, filed on Jul. 16, 2015, the disclosures of which are incorporated herein by reference.

TECHNICAL FIELD

The invention relates to a transparent electrode film and manufacturing method thereof and a dimming element.

BACKGROUND ART

A transparent electrode film including a transparent electrode on a transparent film base is used in various fields of display devices such as flat panel displays (FPDs), light emitting elements, touch panels, dimming elements and the like. For example, Patent Document 1 discloses a dimming film with a liquid crystal layer sandwiched between a pair of transparent electrode films. The transparent electrode film in Patent Document 1 includes on a transparent polymer film a transparent electrode in which a metal oxide thin-film having an organic component and a metal thin-film are stacked.

PRIOR ART DOCUMENT

Patent Document

Patent Document 1: Japanese Patent Laid-open Publication No. 2008-107549

SUMMARY OF THE INVENTION

Problems to be Solved by the Invention

In a transparent electrode film that is used in a dimming element, a metal layer may be degraded. Particularly, in a dimming film with an electrolyte layer sandwiched between a pair of transparent electrode films, degradation (corrosion, dissolution or the like) of a metal layer easily occurs due to passage of a current through a transparent electrode. An object of the present invention is to provide a transparent electrode film including a transparent electrode, which is inhibited from suffering degradation of a metal member while having low resistance.

Means for Solving the Problems

A transparent electrode film of the present invention includes a transparent electrode on a transparent film base, the transparent electrode including a transparent conductive layer and a conductive metal pattern layer. The conductive metal pattern layer is patterned in an in-plane direction of the transparent film base. In the region where the conductive metal pattern layer is provided, the transparent electrode film includes the transparent conductive layer and a protecting layer, and the conductive metal pattern layer is disposed closer to the transparent film base than the transparent conductive layer and the protecting layer.

In the transparent electrode film of the present invention, the transparent conductive layer is also disposed at an opening section where the conductive metal pattern layer is absent, thereby bringing the conductive metal pattern layers separated from each other into conduction. The opening section of the conductive metal pattern layer may be provided with the protecting layer, or may be absent of the protecting layer.

The protecting layer is composed of at least one selected from the group consisting of a precious metal and an oxide. The thickness of the protecting layer is preferably 1 to 50 nm. The oxidation-reduction potential of the protecting layer is preferably higher than the oxidation-reduction potential of the conductive metal pattern layer.

Examples of the precious metal that constitutes the protecting layer include gold and silver. Examples of the oxide include titanium oxide. The protecting layer may be an oxide film of a metal that constitutes the conductive metal pattern layer. When the protecting layer is an oxide layer, the relative dielectric constant of the protecting layer is preferably 10 or more.

The transparent electrode film of the present invention is obtained by forming a conductive metal pattern layer on a transparent film base, and then forming a protecting layer and a transparent conductive layer. The protecting layer may be formed before or after formation of the transparent conductive layer. The transparent conductive layer is formed so as to cover the conductive metal pattern layer, and the opening section where the conductive metal pattern layer is absent.

The conductive metal pattern layer may have a stacked-layer configuration. For example, the conductive metal pattern layer may be configured to include a metal adhesive layer disposed in contact with the transparent film base, and a metal thin-film layer disposed on top of the metal adhesive layer.

The present invention also relates to a dimming element with a dimming layer sandwiched between a pair of transparent electrode substrates. In the dimming element of the present invention, at least one of the pair of transparent electrode substrates is the transparent electrode film.

Effect of the Invention

A transparent electrode film of the present invention is inhibited from suffering degradation of a metal section contained in a transparent electrode while having low resistance. The transparent electrode film of the present invention can be used as, for example, a transparent electrode substrate of a dimming element.

MODE FOR CARRYING OUT THE INVENTION

A transparent electrode film of the present invention includes a conductive metal pattern layer on a transparent film base. The conductive metal pattern layer is patterned in an in-plane direction of the transparent film base. Examples of the pattern shape include stripe shapes, square lattice shapes, diamond lattice shapes, mesh shapes such as honeycomb shapes, and patterns in which a plurality of dots are arranged.

A transparent conductive layer is disposed so as to cover the conductive metal pattern layer and an opening section between patterns. In addition to the transparent conductive layer, a protecting layer is disposed on the conductive metal pattern layer. The protecting layer may cover an opening between patterns on the conductive metal pattern layer. FIGS. 1 to 4 are sectional views of a transparent electrode film according to an embodiment of the present invention. In the transparent electrode film of the present invention, a stacked-layer section ML includes a conductive metal pattern layer, a transparent conductive layer and a protecting layer. A conductive metal pattern layer 13 and a transparent conductive layer 15 may be collectively referred to as a transparent electrode 35. In the example described below, a plurality of layers are stacked on one surface of a transparent film base 12, but the transparent electrode film of the present invention may have a transparent electrode on each of both surfaces of the transparent film base.

Figure 1:
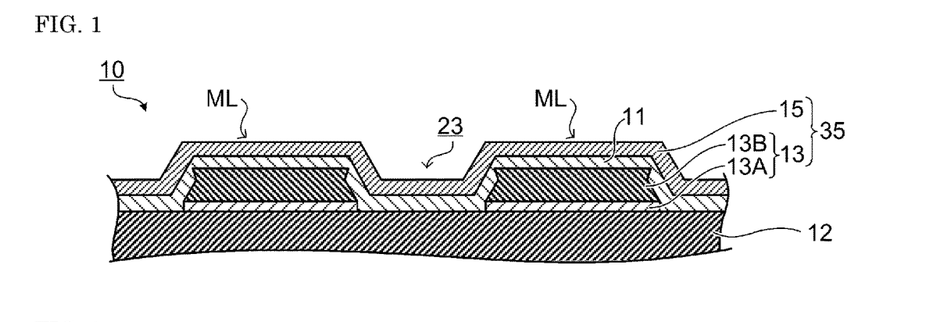
FIG. 1 is sectional views of a transparent electrode film.

A transparent electrode film 10 shown in FIG. 1 has the conductive metal pattern layer 13 on the transparent film base 12. A protecting layer 11 and the transparent conductive layer 15 are sequentially disposed so as to cover the upper surface and the lateral surface of the conductive metal pattern layer 13. At an opening section 23 of the conductive metal pattern layer (region having no conductive metal layer), the protecting layer 11 and the transparent conductive layer 15 are sequentially disposed on the transparent film base 12.

Figure 2:
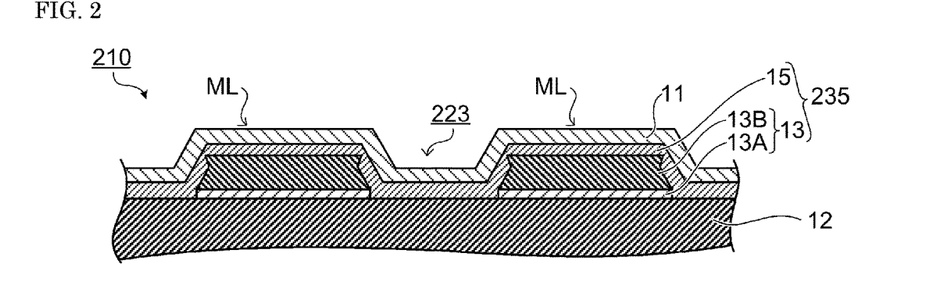
FIG. 2 is sectional views of a transparent electrode film.

In a transparent electrode film 210 shown in FIG. 2, the transparent conductive layer 15 and the protecting layer 11 are sequentially disposed so as to cover the upper surface and the lateral surface of the conductive metal pattern layer 13. At an opening section 223 of the conductive metal pattern layer, the transparent conductive layer 15 and the protecting layer 11 are sequentially disposed on the transparent film base 12.

Figure 3:
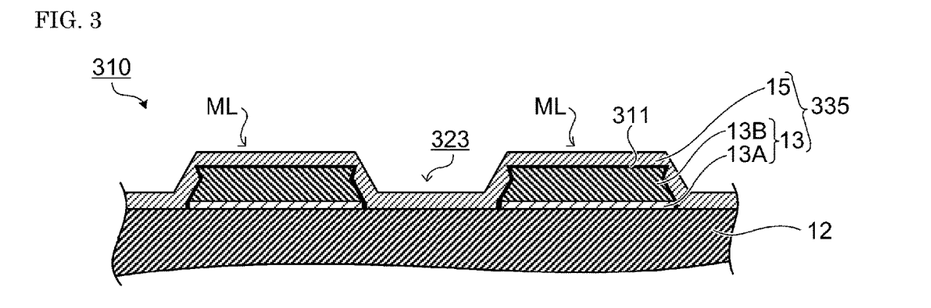
FIG. 3 is sectional views of a transparent electrode film.

In a transparent electrode film 310 shown in FIG. 3, a protecting layer 311 and the transparent conductive layer 15 are sequentially disposed so as to cover the upper surface and the lateral surface of the conductive metal pattern layer 13. The protecting layer is not disposed over an opening section 323 of the conductive metal pattern layer, and the transparent conductive layer 15 is disposed on the transparent film base 12.

Figure 4:
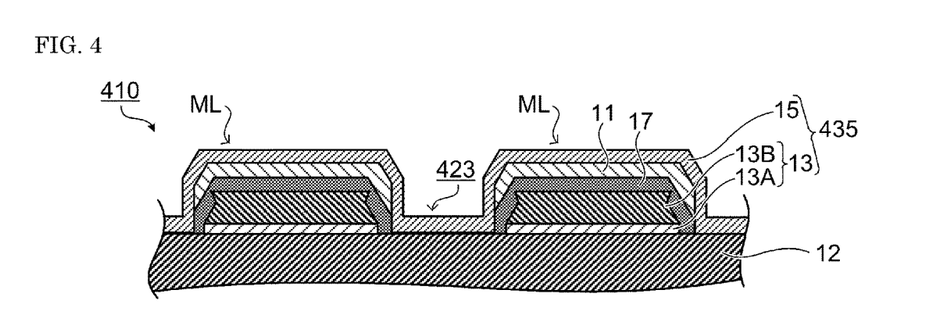
FIG. 4 is sectional views of a transparent electrode film.
Figure 5:
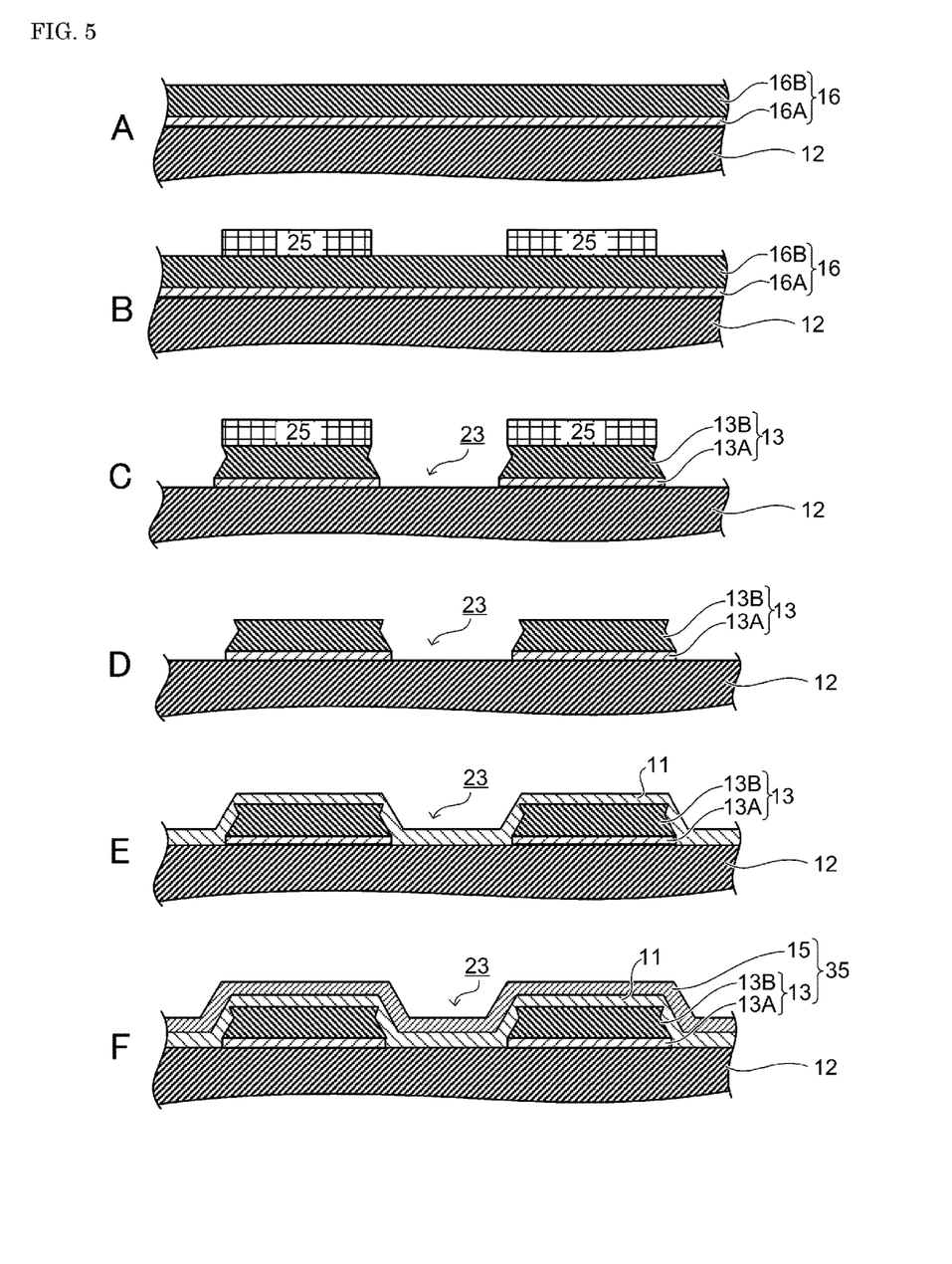
FIGS. 5A to 5F are conceptual views showing process for manufacturing a transparent electrode film

In a transparent electrode film 410 shown in FIG. 4, a coupling agent layer 17 and the protecting layer 11 are disposed so as to cover the upper surface of the conductive metal pattern layer 13. The coupling agent layer 17 and the protecting layer 11 may cover a part of the lateral surface of the conductive metal pattern layer 13. A coupling agent layer and a protecting layer are not disposed over an opening section 423 of the conductive metal pattern layer, and the transparent conductive layer 15 is disposed on the transparent film base 12.

Hereinafter, details of a configuration of the transparent electrode film 10 shown in FIG. 1, and a method for manufacturing the transparent electrode film 10 will be described.

<Transparent Film Base>

The material of the transparent film base 12 is not particularly limited as long as it is colorless and transparent at least in a visible light region, and has heat resistance to a heating temperature in formation of a metal layer and a transparent conductive layer on the transparent film base 12. Examples of the material of the transparent film base 12 include polyester-based resins such as polyethylene terephthalate (PET), polybutylene terephthalate (PBT) and polyethylene naphthalate (PEN); cycloolefin-based resins; polycarbonate resins; polyimide resins; and cellulose-based resins. Among them, polyester-based resins are preferable, and polyethylene terephthalate is especially preferable because they are inexpensive and excellent in transparency.

Although the thickness of the transparent film base 12 is not particularly limited, the thickness is preferably 10 to 400 μm, more preferably 20 to 200 μm. When the thickness of the transparent film base 12 falls within the above-mentioned range, the transparent film base and a transparent electrode film obtained using the transparent film base have sufficient durability and moderate flexibility. When the thickness of the transparent film base 12 falls within the above-mentioned range, a metal layer and a transparent conductive layer can be formed by a roll-to-roll method, and therefore productivity of the transparent electrode film can be improved.

Functional layers such as an optical adjustment layer, an easily adhesive layer and a hard coat layer may be disposed on the transparent film base 12. For example, when an optical adjustment layer having a refractive index different from that of the film base is disposed on the transparent film base, the reflectivity of the transparent electrode film can be reduced, and wavelength selectivity can be imparted to the light-transmittance and reflectivity.

<Conductive Metal Pattern Layer>

The conductive metal pattern layer 13 is one of layers that contribute to the conductivity of the transparent electrode film 10. Generally, a conductive metal layer has light-shielding property. By patterning a conductive metal layer in a stripe shape or a mesh shape to provide the opening section 23, the light-transmissivity of the transparent electrode film can be secured. It can be said that the patterned metal layer is visually transparent because it is hardly visible.

The line width of the patterned metal layer and the distance between adjacent pattern pieces are appropriately set in such a manner that the transparent electrode film 10 has desired transparency (opening ratio) and sheet resistance. For example, for increasing the opening ratio to improve the light-transmittance of the transparent electrode film 10, the line width of the pattern piece is preferably 300 μm or less, more preferably 200 μm or less, further preferably 150 μm or less. For suppression of breakage of the pattern piece to reduce the resistance of the transparent electrode film, the line width of the pattern piece is preferably 0.5 μm or more, more preferably 1 μm or more.

For example, when a metal layer is patterned by a subtractive method, the line width of the pattern piece is preferably 20 μm or more, more preferably 30 μm or more. When the width of the pattern piece changes in a thickness direction, the maximum width in the thickness direction is defined as a line width of the pattern piece (conductive metal pattern layer 13). The distance between adjacent pattern pieces is preferably 0.05 to 10 mm, more preferably 0.1 to 6 mm. By adjusting the ratio of the line width of the pattern piece and the distance between pattern pieces, the opening ratio of the conductive metal pattern layer 13 is adjusted. Accordingly, the light-transmittance of the transparent electrode film 10 can be adjusted.

The conductive metal pattern layer 13 may have a single-layer or stacked-layer structure. For example, the single-layer conductive metal pattern layer 13 may be formed directly on the transparent film base 12. Examples of the stacked-layer configuration of the conductive metal pattern layer may include a configuration with a metal adhesive layer 13A which is present as a lower layer on the film base side and a single-layer or multilayer metal thin-film layer 13B disposed on the metal adhesive layer 13A.

When the conductive metal pattern layer 13 has a stacked-layer configuration with the metal adhesive layer 13A and the metal thin-film layer 13B, ingress of an etchant between the metal thin-film layer 13B and the transparent film base 12 is inhibited in patterning by a subtractive method as described in detail later. Thus, etching more easily proceeds in the upper part than in the lower part of the metal thin-film layer 13B, so that a conductive metal pattern layer having a trapezoidal cross-section is easily formed.

(Metal Adhesive Layer)

The metal adhesive layer 13A is a layer for more firmly bonding the metal thin-film layer 13B to the transparent film base 12. Although the material of the metal adhesive layer 13A is not particularly limited as long as it is a metal, alloy materials such as chromium-cobalt alloys, aluminum-titanium alloys, aluminum-chromium alloys, aluminum-vanadium alloys, nickel-chromium-molybdenum alloys, cobalt-nickel alloys, nickel-titanium alloys, copper-aluminum-zinc alloys, nickel-copper alloys and nickel-chromium-silicon alloys are preferable for improving adhesion between the metal thin-film layer and the transparent film base. Among them, alloys including nickel are preferable, and nickel-copper alloys are especially preferable.

(Metal Thin-Film Layer)

The material of the metal thin-film layer 13B is not particularly limited as long as it is a metal, and examples thereof include nickel, cobalt, molybdenum, aluminum, tin, silver, titanium, vanadium, chromium, iron, copper and tungsten. The material of the metal thin-film layer 13B may be an alloy including two or more of the above-mentioned metals.

For improving the coverage ratio of the transparent conductive layer 15 over the metal thin-film layer 13B, the thickness of the metal thin-film layer 13B is preferably 6000 nm or less, more preferably 5000 nm or less, further preferably 2000 nm or less. For reducing the sheet resistance of the transparent electrode film 10, the thickness of the metal thin-film layer 13B is preferably 50 nm or more, more preferably 100 nm or more, further preferably 200 nm or more.

<Protecting Layer>

The protecting layer 11 has an effect of suppressing degradation (corrosion etc.) of the conductive metal pattern layer 13 by directly or indirectly covering the conductive metal pattern layer 13. The protecting layer 11 may have a single-layer or stacked-layer structure.

In the transparent electrode film 10 shown in FIG. 1, the protecting layer 11 covers the upper surface and the lateral surface of the conductive metal pattern layer 13, and the transparent film base 12 exposed between pattern pieces (opening section 23). When the protecting layer 11 is formed not only on the conductive metal pattern layer 13 but also at the opening section 23, the lateral surface and the periphery of the lower part of the conductive metal pattern are also covered with the protecting layer, and therefore degradation of the conductive metal pattern layer 13 can be more reliably suppressed.

As the material of the protecting layer 11, a metal more precious (a metal having a lower ionization tendency) or a metal compound having a higher dielectric constant is used as compared to the metal of the conductive metal pattern layer 13. The precious metal to be used as the material of the protecting layer 11 is preferably silver, platinum or gold from the viewpoint of a balance between corrosion prevention performance and transparency. Typical examples of the metal compound having a high dielectric constant include metal oxides. The metal oxide is preferably a metal oxide such as indium oxide, bismuth oxide, zinc oxide, tungsten oxide, tin oxide, cobalt oxide, germanium oxide, aluminum oxide or titanium oxide. From the viewpoint of a balance between corrosion prevention performance and transparency, the metal oxide is preferably zinc oxide, tin oxide, titanium oxide or a mixture thereof, particularly preferably titanium oxide.

The metal compound to be used for the protecting layer may be opaque. For example, a brown or black oxide such as copper oxide may be used as a material of the protecting layer. When an opaque metal compound is used, it is preferable that as shown in FIG. 3 and FIG. 4, the protecting layer is not disposed at the opening section of the conductive metal pattern layer from the viewpoint of securing the transparency of the transparent electrode film. Examples of the metal compound to be used for the protecting layer include nitrides, oxynitrides, hydroxides, sulfides, phosphides and halides, in addition to oxides.

Preferably, the protecting layer 11 has an oxidation-reduction potential higher than that of the conductive metal pattern layer 13. For example, when the conductive metal pattern layer 13 of a transparent electrode film on the anode side is covered with the protecting layer 11 having a high oxidation-reduction potential in a dimming film with an electrolyte layer sandwiched between a pair of transparent electrode films, ionization of the conductive metal pattern layer 13 can be suppressed to prevent corrosion. For securing resistance to corrosion of the conductive metal pattern layer, the difference in oxidation-reduction potential between the protecting layer 11 and the conductive metal pattern layer 13 is preferably 0.5 V or more, more preferably 1.0 V or more.

Corrosion of the conductive metal pattern layer 13 can also be prevented when the protecting layer 11 has a high dielectric constant. When the protecting layer 11 is a metal compound layer including a metal oxide etc., the relative dielectric constant of the protecting layer is preferably 10 or more, more preferably 15 or more for preventing corrosion of the conductive metal pattern layer due to passage of a current between the protecting layer 11 and the conductive metal pattern layer 13. When the protecting layer 11 includes a metal oxide, a material having a dielectric constant larger than that of the transparent conductive layer 15 is used.

The thickness of the protecting layer 11 may be appropriately set with consideration given to an effect of preventing corrosion of the conductive metal pattern layer 13 and light-transmissivity at the opening section 23, and for example, the thickness of the protecting layer 11 is preferably 1 to 50 nm, more preferably 3 to 30 nm, further preferably 5 to 25 nm.

<Transparent Conductive Layer>

The transparent conductive layer 15 is a layer that contributes to the conductivity of the transparent electrode film 10 along with the conductive metal pattern layer 13. The transparent conductive layer 15 may have a single-layer or stacked-layer structure.

The transparent conductive layer 15 is a layer mainly composed of a conductive oxide, and the content of the conductive oxide in the transparent conductive layer 15 is more than 50% by weight. The content of the conductive oxide in the transparent conductive layer 15 is preferably 70% by weight or more, more preferably 85% by weight or more.

Examples of the conductive oxide include zinc oxide, indium oxide, tin oxide and composite oxides thereof. From the viewpoint of conductivity, transparency and long-term reliability, a conductive oxide mainly composed of an indium-based oxide is preferable. The content of indium oxide in the transparent conductive layer 15 is preferably 87.5 to 99% by weight or less, more preferably 90 to 95% by weight.

The transparent conductive layer 15 may contain a doped impurity. Examples of the doped impurity for indium oxide include tin oxide, zinc oxide, titanium oxide, tungsten oxide and cerium oxide. Among them, tin oxide is preferable. In other words, the transparent conductive layer 15 is preferably one mainly composed of indium tin oxide (ITO). The content of tin oxide in ITO is preferably 1 to 12.5% by weight, more preferably 5 to 10% by weight.

The thickness of the transparent conductive layer 15 is preferably 10 to 300 nm, more preferably 20 to 200 nm, further preferably 30 to 150 nm. When the thickness of the transparent conductive layer 15 is 20 nm or more, the coverage ratio of the transparent conductive layer 15 over the conductive metal pattern layer 13 increases, so that breakage on the periphery of the upper part and on the periphery of the lower part of the pattern piece is suppressed. When the thickness of the transparent conductive layer 15 is 300 nm or less, transparency at the opening section 23 can be secured. The thickness of the transparent conductive layer disposed on the conductive metal pattern layer 13 may be identical to or different from the thickness of the transparent conductive layer 15 disposed at the opening section 23. When both the transparent conductive layers have different thicknesses, it is preferable that each of the thicknesses falls within the above-mentioned range.

<Method for Manufacturing Transparent Electrode Film>

The transparent electrode film 10 shown in FIG. 1 is obtained by disposing the conductive metal pattern layer 13 on the transparent film base 12, and forming the protecting layer 11 and the transparent conductive layer 15 on the conductive metal pattern layer 13. Examples of the method for patterning the metal layer include a method in which a mask pattern is provided on the metal layer using a resist etc., and a region that is not covered with the mask is etched (i.e., a subtractive method).

Hereinafter, one example of a method for manufacturing the transparent electrode film 10 in FIG. 1 will be described with reference to FIGS. 5A to 5F.

First, a conductive metal film 16 in which a metal adhesive layer 16A and a metal thin-film layer 16B are stacked on the transparent film base 12 is formed as shown in FIG. 5A. The conductive metal film 16 is a layer that is a basis for the conductive metal pattern layer 13.

The method for depositing the metal adhesive layer 16A and the metal thin-film layer 16B is not particularly limited, and examples thereof include a sputtering method, a vapor deposition method and a plating method. When the metal adhesive layer 16A is formed by a plating method, an electroless plating method is preferable. Either electroless plating or electroplating can be applied for formation of the metal thin-film layer 16B that is disposed on the metal adhesive layer 16A.

The above-mentioned deposition methods may be combined to form the metal thin-film layer 16B including a plurality of layers. For example, a first layer of the metal thin-film layer 16B may be formed by a dry process such as a sputtering method or a vapor deposition method, followed by forming a second layer of the metal thin-film layer 16B on the first layer by an electroplating method. The first layer of the metal thin-film layer 16B not only has an effect of improving the adhesion of the metal thin-film layer 16B to the metal adhesive layer 16A, but also functions as a seed layer in formation of the second layer by a plating method.

When the metal layer is patterned by a subtractive method, a mask pattern 25 is formed on the conductive metal film 16 as shown in FIG. 5B. Examples of the method for forming the mask pattern 25 include a photolithography method. In the photolithography method, a photoresist material is applied onto the metal thin-film layer 16B, then exposed using a photomask to cure the resist, and the resist is then developed to form a mask pattern (resist pattern) 25.

Next, using an etchant, the conductive metal film 16 is patterned to form the conductive metal pattern layer 13 (patterning step) as shown in FIG. 5C. In other words, the conductive metal film 16 exposed to a region (a region below the opening of the mask pattern) where the mask pattern is not provided is removed by the etchant. As the etchant, a solution containing an oxidant such as ferric chloride or cupric chloride, an acid-based solution, a peroxide-based solution, an acid/amine-based solution or the like may be used according to the kind of metal.

In the subtractive method, a part close to the mask surface in the thickness direction tends to be etched preferentially. When the metal adhesive layer is disposed on the transparent film base 12, ingress of the etchant between the metal thin-film layer and the transparent film base 12 hardly occurs in patterning of the metal layer by wet etching. Thus, the metal thin-film layer 13B is apt to have a cross-sectionally tetragonal shape having a tapered cross-section tapered in a direction away from the transparent film base 12 (toward the upper side in the drawing), or a lateral surface extending along a direction perpendicular to the surface of the transparent film base 12. In other words, the cross-sectional shape of the metal thin-film layer 13B is apt to be a trapezoidal or rectangular shape. In the subtractive method, a part in the vicinity of a contact point between the metal thin-film layer and the mask is hardly etched, and therefore the metal thin-film layer 13B may have a hood-like protruding section in the vicinity of the interface between the metal thin-film layer 13B and the protecting layer 11.

The method for forming the conductive metal pattern layer 13 is not limited to the subtractive method shown in FIGS. 5A to 5C. For example, the metal thin-film layer 13B has a two-layer structure with a lower layer and an upper layer, steps substantially identical to those in a semi-additive method in a technique for manufacturing a printed circuit board may be employed. In the semi-additive method, a mask pattern is provided after formation of a lower layer, and an upper lower is formed at an opening section of the mask pattern by a plating method. Thereafter, the mask pattern is removed, and the lower layer exposed between the upper layers is removed by etching to obtain a metal pattern including the lower layer (seed layer) and the upper layer.

The conductive metal pattern layer 13 may be formed by patterning using a laser scribing method etc., or by a printing method such as an inkjet printing method, a microcontact printing method or screen printing method.

After formation of the conductive metal pattern layer 13, the mask pattern 25 is removed with a resist stripping liquid as shown in FIG. 5D. Thereafter, the protecting layer 11 is deposited (protecting layer forming step) as shown in FIG. 5E, and the transparent conductive layer 15 is deposited on the protecting layer 11 (transparent conductive layer forming step) as shown in FIG. 5F.

The method for depositing the protecting layer 11 is not particularly limited, and a sputtering method, a vapor deposition method, an electron beam deposition method, a CVD method, a plating method or the like may be selected according to a material. In these methods, a roll-to-roll method with high productivity can be employed. The method for forming the transparent conductive layer 15 is preferably a sputtering method from the viewpoint of productivity. The sputtering method is especially preferably a magnetron sputtering method. The power supply to be used for sputtering is not particularly limited, and a direct-current power supply or an alternating-current power supply is appropriately selected according to a material of a target.

Preferably, the steps of depositing the conductive metal film 16, forming the mask pattern 25 (applying, exposing and developing the photoresist material), etching, removing the mask pattern, depositing the protecting layer 11, and depositing the transparent conductive layer 15 are carried out using a roll-to-roll method. Employment of a roll-to-roll method dramatically improves productivity of the transparent electrode film 10.

The transparent electrode film 10 shown in FIG. 1 is completed by passing through the steps described above. The transparent electrode film 10 includes the stacked-layer section ML where the conductive metal pattern layer 13, the protecting layer 11 and the transparent conductive layer 15 are stacked, and an opening section 23 where the conductive metal pattern layer is absent. In the stacked-layer section ML, the conductive metal pattern layer 13 is disposed closer to the transparent film base 12 than the transparent conductive layer 15 and the protecting layer 11.

The conductive metal pattern layer 13 is covered with the protecting layer 11. Thus, even if an external factor (e.g., a dimming layer as described later) that degrades the conductive metal pattern layer 13 comes into contact with the transparent electrode film 10, degradation of the conductive metal pattern layer 13 is suppressed.

The transparent conductive layer 15 is formed not only on the conductive metal pattern layer 13 but also at the opening section 23 between pattern pieces. Since the transparent conductive layer is disposed so as to extend over the conductive metal pattern layer 13 and the opening section 23, pattern pieces disposed so as to be separated from one another are in conduction with one another through the transparent conductive layer. When the cross-sectional shape of the conductive metal pattern layer is a trapezoidal shape, the width in the lower part (on the transparent film base 12 side) is larger than the width in the upper part (on the transparent conductive layer 15-formed side), and therefore the lateral surface and the periphery of the lower part of the conductive metal pattern layer 13 are easily covered with the transparent conductive layer 15 formed on the conductive metal pattern layer 13. Thus, the coverage ratio of the transparent conductive layer 15 over the conductive metal pattern layer 13 tends to increase. When the coverage ratio is high, breakage of the transparent conductive layer 15 at the lateral surface or the periphery of the lower part of the conductive metal pattern layer 13 is suppressed, so that the sheet resistance of the transparent electrode film can be reduced.

[Modification of Stacked-Layer Form of Transparent Electrode Film]

In the transparent electrode film of the present invention, the transparent conductive layer 15 may be disposed on the conductive metal pattern layer 13, with the protecting layer 11 disposed on the transparent conductive layer 15 as shown in FIG. 2. In this stacking configuration, the conductive metal pattern layer 13 is indirectly covered with the protecting layer 11.

Figure 6:
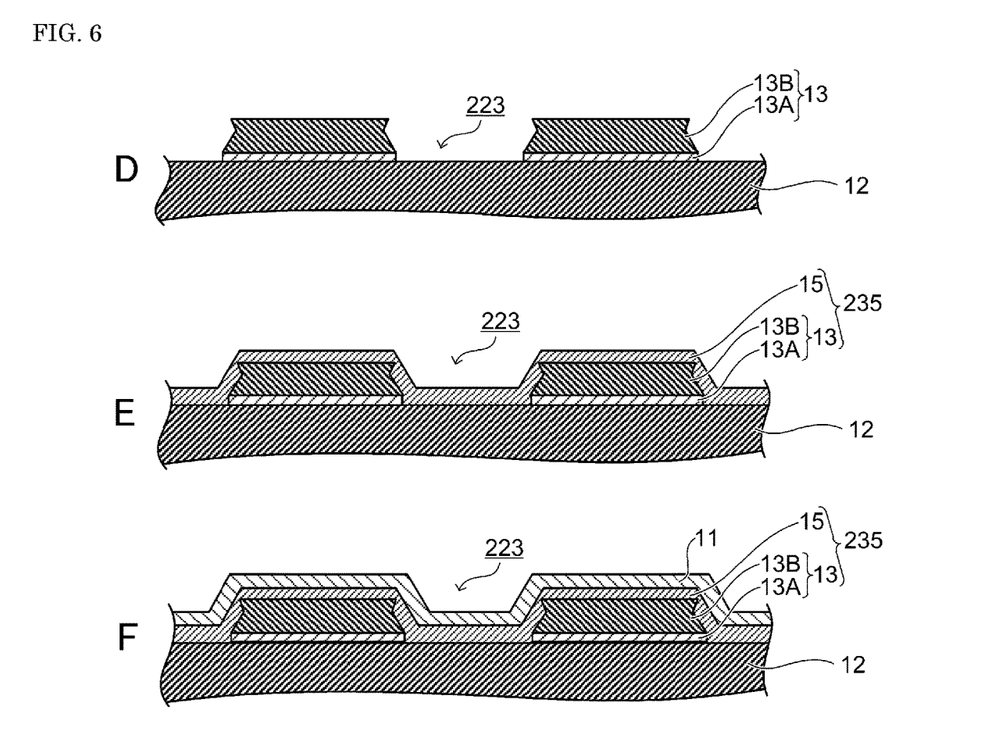
FIGS. 6D to 6F are conceptual views showing process for manufacturing a transparent electrode film

FIG. 6 is a conceptual view showing one example of a process for manufacturing the transparent electrode film 210 shown in FIG. 2. In this manufacturing method, first the conductive metal pattern layer 13 having the opening section 223 is formed on the transparent film base 12 as shown in FIG. 6D. Up to this, there is no difference between this method and the process for manufacturing the transparent electrode film 10 shown in FIG. 1 (see FIGS. 5A to 5D).

After formation of the conductive metal pattern layer 13, the transparent conductive layer 15 is deposited as shown in FIG. 6E, and the protecting layer 11 is deposited as shown in FIG. 6F. In a region where a pattern piece of the conductive metal pattern layer 13 is disposed, the transparent electrode film 210 includes the conductive metal pattern layer 13, the transparent conductive layer 15 and the protecting layer 11 sequentially stacked on the transparent film base 12. At an opening section 223 of the conductive metal pattern layer, the transparent conductive layer 15 and the protecting layer 11 are sequentially stacked on the transparent film base 12.

In the transparent electrode film of the present invention, the opening section of the conductive metal pattern layer is not required to be covered with the protecting layer. In the form shown in FIG. 3, the surface of the conductive metal pattern layer 13 is covered with a protecting covering 311 as the protecting layer. The protecting covering 311 can be formed by chemically treating the surface of the conductive metal pattern layer, or selectively precipitating a metal etc. on the surface of the conductive metal pattern layer.

Examples of the protecting covering 311 formed by chemically treating the surface of the conductive metal pattern layer include oxide films. When an oxide film is disposed on the surface of a metal, the surface is blackened to reduce metallic luster, so that deterioration of visibility due to reflection of light by the conductive metal pattern layer 13 can be prevented.

The conductive metal pattern layer 13 includes copper or a copper alloy, an oxide film can be provided by black oxide treatment or brown oxide treatment. For example, a black oxide film can be formed on the surface of copper by bringing a strong oxidizing agent such as sodium chlorite into contact with an alkaline aqueous solution.

The protecting covering formed by chemically treating the surface of the conductive metal pattern layer may include a metal compound other than an oxide. For example, a nitride such as copper nitride, or an oxynitride such as copper oxynitride may be provided as a protecting covering.

Examples of the method for selectively precipitating a metal on the surface of the conductive metal pattern layer include displacement plating and electroplating. For example, when the conductive metal pattern layer 13 contains copper, a tin protecting layer can be formed on the upper part and the lateral surface of the conductive metal pattern layer by displacement tin plating. Examples of the metal that is selectively precipitated on the surface of the conductive metal pattern layer include palladium, nickel and chromium in addition to tin.

In this form, the protecting layer is selectively disposed on the conductive metal pattern layer 13, and the protecting layer is not disposed over the opening section 423 of the conductive metal pattern. Thus, the light-transmittance at the opening section is increased, so that the transparency of the transparent electrode film can be improved.

In the transparent electrode film of the present invention, a layer other than the conductive metal pattern layer, the protecting layer and the transparent conductive layer may be disposed on the transparent film base. For example, in the transparent electrode film 410 shown in FIG. 4, the coupling agent layer 17 is disposed on the conductive metal pattern layer 13, and the protecting layer 11 and the transparent conductive layer 15 are disposed on the coupling agent layer 17.

The coupling agent layer has higher bondability to the conductive metal pattern layer 13 than to the transparent film base 12. When a coupling agent layer 27 having a characteristic as described above is disposed, and the coupling agent layer disposed at the opening section of the conductive metal pattern is peeled from the transparent film base 12, the protecting layer is patterned, and therefore a transparent electrode film having high light-transmissivity is obtained.

Figure 7:
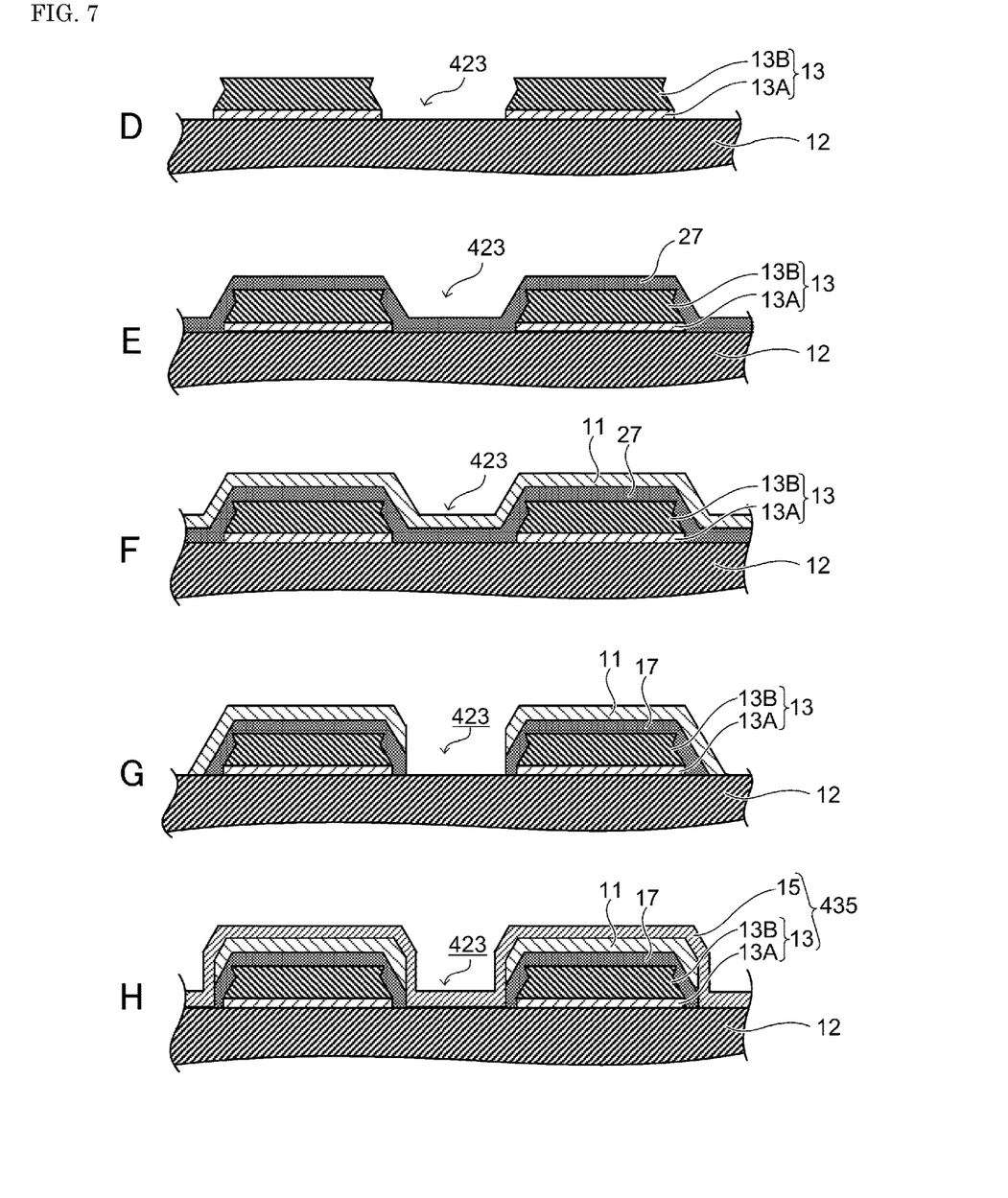
FIGS. 7D to 7H are conceptual views showing process for manufacturing a transparent electrode film

A method for manufacturing the transparent electrode film 410 shown in FIG. 4 will be described with reference to FIGS. 7D to 7H. In this embodiment, as with the form shown in FIG. 5, first the conductive metal pattern layer 13 having the opening section 423 is formed on the transparent film base 12 (FIG. 7D). Up to this, there is no difference between this method and the process for manufacturing the transparent electrode film 10 shown in FIG. 1 (see FIGS. 5A to 5D).

As shown in FIG. 7E, the coupling agent layer 27 is formed on the transparent film base 12 provided with the conductive metal pattern layer 13. The coupling agent layer 27 is disposed so as to cover the conductive metal pattern layer 13 and the transparent film base 12 exposed between pattern pieces (opening section 423).

A composition (solution) containing a coupling agent is applied, and dried and cured to form the coupling agent layer. Accordingly, the coupling agent layer 27 contains a cured product of a coupling agent. Preferably, the coupling agent that constitutes the coupling agent layer 27 has high bondability to a metal. The coupling agent is preferably a silane coupling agent. In particular, a silane coupling agent containing an amino group or an acid anhydride group is preferable because it is easily removed with an alkali-based stripping liquid.

Specific examples of the silane coupling agent containing an amino group include 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane and 3-(N-phenyl)aminopropyltrimethoxysilane. Specific examples of the silane coupling agent containing an acid anhydride group include 3-triethoxysilylpropylsuccinic acid anhydride, 3-trimethoxysilylpropylsuccinic acid anhydride, 3-methyldimethoxysilylpropylsuccinic acid anhydride, methyldiethoxysilylpropylsuccinic acid anhydride and 1-carboxy-3-triethoxysilylpropylsuccinic acid anhydride. These silane coupling agents may be used alone, or used in combination of two or more thereof.

Preferably, the solution contains a curing agent in addition to the coupling agent. As the curing agent, for example, an organic metal compound as a curing catalyst is used. A photopolymerization initiator such as a photoacid generator, a photobase generator or a photoradical generator may be used as a curing agent. Such a curing agent may be appropriately selected according to a composition of the coupling agent, a curing method and so on. For example, when curing is performed at normal temperature, an organic metal compound can be used as a curing agent. When polymerization is performed by irradiation with an active ray such as an ultraviolet ray, it is preferable to use a photopolymerization initiator as a curing agent. When a silicon-based resin having an alkoxysilyl group is used as a coupling agent, a photobase generator is preferably used as a photocuring agent. The use amount of the photocuring agent is not particularly limited, but is preferably about 0.5 to 10 parts by weight based on 100 parts by weight of the coupling agent.

For reducing the influence of the transparent electrode film on the resistance value, the thickness of the coupling agent layer 17 on the conductive metal pattern layer 13 is preferably 5 µm or less. For shortening the curing time of the coupling agent layer, and from the viewpoint of adhesion and reduction of contact resistance with the conductive metal pattern layer 13, the thickness of the coupling agent layer 17 is more preferably 1 µm or less, further preferably 0.5 µm or less. The thickness of the coupling agent layer that is disposed over the opening section of the conductive metal pattern layer is not particularly limited because the coupling agent layer is peeled off later. Therefore, the application thickness of the solution may be adjusted so that the thickness of the coupling agent layer 17 on the conductive metal pattern layer 13 falls within the above-mentioned range.

As shown in FIG. 7F, the protecting layer 11 is deposited on the coupling agent layer 27 (protecting layer forming step).

Thereafter, the stripping liquid is brought into contact with the film. At the interface between the coupling agent layer 27 and the conductive metal pattern layer 13, ingress of the stripping liquid hardly occurs because the layers are firmly bonded. Ingress of the stripping liquid occurs at an interface of small bonding strength like the interface between the coupling agent layer 27 and the transparent film base 12. Thus, the coupling agent layer disposed on the conductive metal pattern layer 13 is hardly peeled, and the coupling agent layer disposed over the opening section 423 of the conductive metal pattern layer is easily peeled due to ingress of the stripping liquid. When the coupling agent layer 27 at the opening section 423 is peeled, the protecting layer 11 on the coupling agent layer is also removed, and thus the protecting layer 11 is patterned as shown in FIG. 7G.

After the protecting layer 11 is patterned by peeling the coupling agent layer, the transparent conductive layer 15 is deposited as shown in FIG. 7H. By passing through these steps, the transparent electrode film 410 shown in FIG. 4 is obtained.

This embodiment takes advantage of a situation in which the conductive metal pattern layer 13 and the protecting layer 11 are firmly bonded to each other due to interposition of the coupling agent layer between the conductive metal pattern layer 13 and the protecting layer 11, and the coupling agent layer is easily peeled off at the opening section 423 where the metal pattern layer is absent. By removing the coupling agent layer disposed at the opening section 423, the protecting layer 11 disposed on the coupling agent layer can be selectively removed together with the coupling agent layer. Thus, in the transparent electrode film 410, absorption of light by the protecting layer at the opening section 423 does not occur, so that transparency can be improved.

[Uses of Transparent Electrode Film]

The transparent electrode film of the present invention can be used as, for example, a transparent electrode substrate of a flat panel display (FPD) such as a liquid crystal display, an organic EL display or a plasma display, or an electrode for organic EL illumination. The transparent electrode film of the present invention can also be used as a transparent electrode substrate of an electrochromic-type dimming element. Examples of the electrochromic-type dimming element include one in which a dimming layer with a light transmission state varying depending on whether or not a voltage is applied, such as a liquid crystal layer, an electrolyte layer or an electrophoresis layer is sandwiched between a pair of electrodes.

The transparent electrode film of the present invention includes a protecting layer on the conductive metal pattern layer, and therefore even when a current passes with the transparent electrode film being in contact with the dimming layer, degradation of the conductive metal pattern layer (particularly degradation of the anode) is suppressed. Further, the transparent conductive layer is disposed on the conductive metal pattern layer and at the opening section, and therefore pattern pieces of the conductive metal pattern layer which are disposed so as to be separated from one another are in conduction with one another through the transparent electrode. Thus, in the transparent electrode film of the present invention, a voltage can be applied to the whole region of the dimming layer. The dimming element may include the transparent electrode film of the present invention in any one of a pair of transparent electrodes. Particularly, when the transparent electrode film of the present invention is used in an anode, a dimming element having excellent durability is obtained.

EXAMPLES

Hereinafter, the present invention will be described more in detail by showing of examples, but the present invention is not limited to these examples. Each step was carried out using a roll-to-roll method.

Example 1

A PET film having an easily adhesive layer on the surface was set in a sputtering apparatus, and using an alloy target including 60 atom %% of nickel and 40 atom % of copper, sputtering deposition was performed under conditions of a deposition chamber inside pressure of 0.2 Pa, a substrate temperature of 0° C. and a power density of 0.9 W/cm$^2$ while an argon gas and an oxygen gas were introduced into the apparatus, so that a metal adhesive layer having a layer thickness of 25 nm was deposited on the PET film. Using a copper target, sputtering deposition was performed under the same conditions as described above while an argon gas was introduced into the apparatus, so that a metal thin-film layer having a thickness of 575 nm was deposited on the metal adhesive layer. Through these steps, a conductive metal film having a total thickness of 600 nm was deposited.

The conductive metal film was patterned by a photolithography method. A positive resist (manufactured by AZ Electronic Materials Inc.; trade name: AZ-6112) was applied onto the conductive metal film in such a manner that the thickness after drying would be 1 μm, and the resist was dried. Thereafter, the film was exposed with an integrated light amount of 50 mJ/cm$^2$ using a photomask, and developed by immersing the film in a developer (manufactured by AZ Electronic Materials Inc.; a liquid obtained by diluting AZ 400K (trade name) to 25%). Further, the film was rinsed with pure water to form a stripe-shape mask pattern on the conductive metal film.

The conductive metal film exposed below the opening of the mask pattern was etched using a ferric oxide aqueous solution, and rinsed with pure water. Thereafter, the mask pattern was peeled with a stripping liquid (manufactured by AZ Electronic Materials Inc.; trade name: AZ 400K), and the film was rinsed with pure water, and then dried. Through these steps, a stripe-shaped conductive metal pattern layer having a pattern piece line width of 150 μm and a pattern piece distance of 480 μm was formed.

Next, a TiO$_2$ protecting layer was deposited by an electron beam vapor deposition method under conditions of a vacuum degree of $3.0 \times 10^{-4}$ Pa, a total power of 35% and a deposition rate of 1.0 to 1.4 Å/second. The thickness of the protecting layer was 25 nm.

Using indium tin oxide (content of tin oxide: 10% by weight) as a target, sputtering deposition was performed under conditions of an oxygen partial pressure of $2 \times 10^{-4}$ Pa, a deposition chamber inside pressure of 0.2 Pa, a substrate temperature of 0° C. and a power density of 0.9 W/cm$^2$ while a mixed gas of oxygen and argon was introduced into the apparatus, so that an ITO layer having a thickness of 2 nm was deposited. Using indium tin oxide (content of tin oxide: 7% by weight) as a target, sputtering deposition was performed under conditions of an oxygen partial pressure of $2 \times 10^{-3}$ Pa, a deposition chamber inside pressure of 0.2 Pa, a substrate temperature of 0° C. and a power density of 3 W/cm$^2$ while a mixed gas of oxygen and argon was introduced into the apparatus, so that an ITO layer having a thickness of 98 nm was deposited to form two ITO transparent conductive layers having a total thickness of 100 nm.

Through the above steps, a transparent electrode film was obtained in which a conductive metal pattern layer including a Ni—Cu metal adhesive layer and a Cu metal thin-film layer, a TiO$_2$ protecting layer and an ITO transparent conductive layer were sequentially stacked on a PET film base.

Example 2

A conductive metal pattern layer was formed in the same manner as in Example 1, and an ITO transparent conductive layer and a TiO$_2$ protecting layer were then sequentially deposited. That is, in Example 2, a transparent electrode film was prepared in the same manner as in Example 1 except that the sequence of deposition of the protecting layer and the transparent conductive layer was reversed.

Example 3

A conductive metal pattern layer was formed in the same manner as in Example 1, and silver was precipitated on the surface of the conductive metal pattern layer by electroless plating to form a protecting layer. As an electroless plating liquid, an aqueous solution (liquid temperature: 23° C.) obtained by mixing water, a 5 wt % imidazole aqueous solution (manufactured by MacDermid Performance Solutions Japan K.K.; trade name: IM44), nitric acid, and a mixed aqueous solution of 5 wt % silver nitrate and 5 wt % nitric acid (manufactured by MacDermid Performance Solutions Japan K.K.; trade name: IM448) at a volume ratio of 75.2:20:2.3:2.5 was used. The film base after formation of the conductive metal pattern layer was immersed in the above-mentioned aqueous solution for 10 seconds, then rinsed with pure water, and dried to form an Ag protecting layer on the surfaces of the conductive metal pattern layer and a transparent film base exposed at an opening section. The thickness of the protecting layer was about 25 nm.

After formation of the Ag protecting layer on the surface of the conductive metal pattern, two ITO transparent conductive layers having a total thickness of 100 nm were formed in the same manner as in Example 1. Through the above-mentioned steps, a transparent electrode film having on a transparent film base a stacked-layer section including a conductive metal pattern layer, a protecting layer and a transparent conductive layer in this order was prepared.

Example 4

A conductive metal pattern layer was formed in the same manner as in Example 3, and a coupling agent layer was then formed. A coating agent for formation of a coupling agent layer was prepared by mixing 2 parts by weight of 1,2-diisopropyl-3-[bis(dimethylamino)methylene] guanidium 2-(3-benzoylphenyl)propionate (manufactured by Wako Pure Chemical Industries, Ltd.; trade name: WPBG-266) as a photobase generator, and 400 parts by weight of ethyl acetate as a dilution solvent with 100 parts by weight of 3-aminopropyltrimethoxysilane (manufactured by MOMENTIVE Inc.; trade name: SilQuest A-1110). The coating agent was applied to a transparent film base after formation of the conductive metal pattern layer in such a manner that the thickness after drying was 0.2 µm, and the coating agent was dried at 80° C. for 1 minute, and then irradiated with an ultraviolet ray (integrated light amount: 1000 mJ/cm$^2$) to cure the coating agent.

Plating was performed in the same manner as in Example 3 to form an Ag protecting layer on the coupling agent layer. After formation of the protecting layer, the film was left standing at 23° C. for 1 hour, and the coupling agent layer over an opening section of the conductive metal pattern layer and the protecting layer disposed on the coupling agent layer were then peeled using an alkaline stripping liquid (manufactured by AZ Electronic Materials Inc.; trade name: AZ 400K). The film was rinsed with pure water, and then dried. Thereafter, a transparent conductive layer was deposited in the same manner as in Example 3.

By passing through the above-described steps, a transparent electrode film was prepared in which on a transparent film base, a coupling agent layer, a protecting layer and a transparent conductive layer were stacked in this order on a conductive metal pattern layer at a stacked-layer section, a most part of an opening section was absent of the protecting layer, and the transparent film base was covered with the transparent conductive layer.

Comparative Example 1

A stripe-shaped conductive metal pattern layer was formed in the same manner as in Example 1, and a transparent conductive layer was then formed while a protecting layer was not formed. That is, in Comparative Example 1, a transparent electrode film was prepared in the same manner as in Example 1 except that the protecting layer was not formed.

Comparative Example 2

By a method as shown below, a transparent electrode film was prepared in the same manner as in Comparative Example 1 except that the metal thin-film layer in the conductive metal pattern layer had a two-layer structure.

A conductive metal film having a total thickness of 600 nm was deposited by a sputtering method in the same manner as in Example 1, and electroless copper plating was then performed in an electroless copper plating liquid (manufactured by OKUNO CHEMICAL INDUSTRIES CO., LTD; trade name: TSP COPPER) at 50° C. to form a 1400 nm Cu-plated layer. That is, the thickness of the conductive metal pattern layer in Comparative Example 2 was 2000 nm.

Evaluation

The following evaluations were performed for the transparent electrode film obtained in each of Examples 1 to 4 and Comparative Examples 1 and 2.

(Sheet Resistance)

The sheet resistance of the transparent electrode film was measured using an eddy current type resistance measurement apparatus (manufactured by NAPSON CORPORATION; trade name: EC-80).

(Light Transmittance)

The light transmittance of a region including a transparent electrode was measured using a haze meter (manufactured by NIPPON DENSHOKU INDUSTRIES Co., LTD; trade name: NDH 7000).

(Oxidation-Reduction Potential)

The oxidation-reduction potentials of the conductive metal pattern layer and the protecting layer were measured in accordance with JIS K 0213. The oxidation-reduction potential of the $TiO_2$ protecting layer in each of Examples 1 and 2 was 3.0 V, the oxidation-reduction potential of the Ag protecting layer in Example 3 was 1.8 V, and the oxidation-reduction potential of the conductive metal pattern layer was 0.34 V.

(Dielectric Constant)

On a glass substrate, the same protecting layer (titanium oxide layer) as in Example 1 was deposited in a thickness of 1 µm by an electron beam vapor deposition method. The relative dielectric constant of this single-layer film was measured under an environment at a temperature of 23° C. and a humidity of 55% using R8340/R12702A ULTRA HIGH RESISTANCE METER (manufactured by Advantest Corporation).

(Durability of Transparent Electrode Film)

Figure 8:
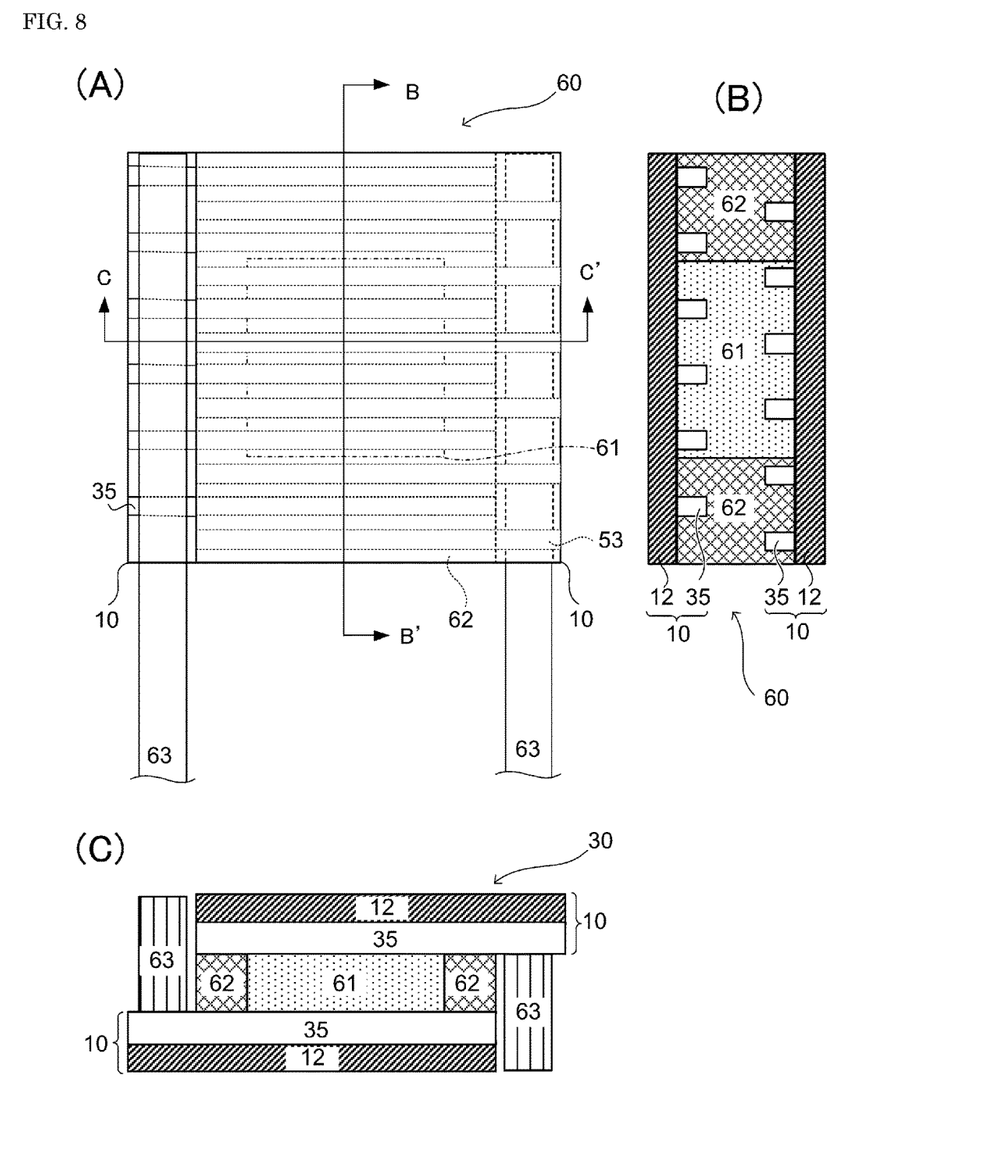
FIG. 8(A) is a plan view showing a durability examination kit.
FIGS. 8(B) and 8(C) are sectional views showing the durability examination kit.

The durability of a transparent electrode film 10 was evaluated using a durability examination kit 60 obtained by sandwiching a conductive curable composition 61 between two transparent electrode films 10 disposed their respective transparent electrodes 35 facing each other, and sealing the periphery thereof with an insulating tape 62. FIG. 8(A) is a plan view of the durability examination kit. FIGS. 8(B) and 8(C) are sectional views taken along line B-B' and line C-C', respectively, in FIG. 8(A). In FIGS. 8(A), 8(B) and 8(C), members of the transparent electrode film other than a transparent film base 12 are illustrated in a simplified form for the sake of convenience.

The conductive curable composition 61 is a mixture of 2.5 parts by weight of a 75 wt % phosphoric acid aqueous solution, 5 parts by weight of a polyether ester-based plasticizer (manufactured by ADEKA CORPORATION; trade name: ADK CIZER RS-700), 9 parts by weight of a polyether main chain-based urethane acrylate (manufactured by DAICEL-ALLNEX LTD.; trade name: EBECRYL230) as a binder component, 1 part by weight of trimethylolpropane triacrylate (manufactured by OSAKA ORGANIC CHEMICAL INDUSTRY LTD; trade name: V#295), 0.06 parts by weight of 2-hydroxy-2-methyl-1-phenyl-propane- 1-one (manufactured by BASF Japan Ltd.; trade name: DAROCUR1173) and 0.03 parts by weight of bis-acylphosphine oxide (manufactured by BASF Japan Ltd.; trade name: IRGACURE819).

On a transparent electrode film cut to 10 cm square, a square space having a size of 5 cm×5 cm was formed with the 200 µm-thick insulating tape 62 as a seal wall, the space was filled with the curable composition 61 without air bubbles until the thickness reached 200 µm, and another transparent electrode film 10 was superimposed to the top of the seal wall. The laminated film with the curable composition 61 filled between two transparent electrode films was introduced into a nitrogen purging box, purged with nitrogen for 2 minutes, and then irradiated with an ultraviolet ray with an integrated light amount of 1000 mJ/cm$^2$ by an UV irradiation apparatus (manufactured by Heraeus Holding GmbH; trade name: Light Hammer) to cure the curable composition. Thereafter, an extraction electrode 63 formed of a copper foil was attached to an end part of the transparent electrode film 10.

Using the durability examination kit 60 thus prepared, a voltage (direct-current) of 1 V was applied between two transparent electrode films for 168 hours. A change in appearance of the conductive metal pattern layer of the transparent electrode film 10 before voltage application and after voltage application for 168 hours was visually examined. Samples showing no change were rated "OK", and samples suffering corrosion (erosion or dissolution) of the conductive metal pattern layer were rated "NG".

The arrangement and configuration of the protecting layer of the transparent electrode film, the thickness of the transparent conductive layer, the thickness of the conductive metal pattern layer and the results of the evaluations described above for the transparent electrode film in each of Examples and Comparative Examples are shown in Table 1.

any of the cathode and the anode was not corroded. In Example 1 where the transparent conductive layer was disposed on the conductive metal pattern layer with the TiO$_2$ protecting layer interposed therebetween, the sheet resistance of the transparent electrode film did not excessively increase.

Comparison between Example 3 and Example 4 shows that Example 3 in which the Ag protecting layer was disposed over the opening section of the conductive metal pattern layer exhibited an improved transmittance.

DESCRIPTION OF REFERENCE CHARACTERS 10, 110, 210, 310, 410 transparent electrode film
11, 311 protecting layer
12 transparent film base
13 conductive metal pattern layer
13A metal adhesive layer
13B metal thin-film layer
16 conductive metal film
16 transparent conductive layer
35 transparent electrode
17 coupling agent layer
23, 123, 223, 323, 423 opening section
25 mask pattern
ML stacked-layer section

The invention claimed is:
1. A transparent electrode film comprising: a transparent film base, and a transparent electrode disposed on the transparent film base, wherein
the transparent electrode includes a transparent conductive layer a protecting layer and a conductive metal pattern layer,
the conductive metal pattern layer is patterned in an in-plane direction of the transparent film base,

TABLE 1

|  |  |  | Example 1 | Example 2 | Example 3 | Example 4 | Comparative Example 1 | Comparative Example 2 |
|---|---|---|---|---|---|---|---|---|
| Protecting layer | Arrangement | Stacked-layer arrangement | On metal thin-film layer | On transparent conductive layer | On metal thin-film layer | | — | — |
| | | Over opening section | Present | Present | Present | Not present | | |
| | Material | | TiO$_2$ | TiO$_2$ | Ag | | | |
| | Thickness (nm) | | 25 | 25 | 25 | | | |
| | Oxidation-reduction potential (V) | | 3.0 | 3.0 | 1.8 | | | |
| | Relative dielectric constant | | 48 | 48 | N.D. | | | |
| Transparent conductive layer | Thickness (nm) | | | | | 100 | | |
| Conductive metal pattern layer | Thickness (nm) | | 600 | 600 | 600 | 600 | 600 | 2000 |
| Evaluation | Sheet resistance (Ω/sq) | | 2.0 | 2.2 | 1.9 | 1.8 | 1.8 | 0.5 |
| | Total light transmittance (%) | | 64 | 63 | 60 | 66 | 65 | 64 |
| | Continuous electrical current test | | OK | OK | OK | OK | NG | NG |

In Comparative Example 1 and Comparative Example 2 where the protecting layer was not disposed on the conductive metal pattern layer, the metal pattern layer of the transparent electrode film after a continuous electrical current test for 168 hours was corroded, and the corrosion was particularly noticeable in the anode. On the other hand, in Examples 1 to 4 where the protecting layer was disposed directly or indirectly on the conductive metal pattern layer, the metal pattern layer of the transparent electrode film in the transparent conductive layer and the protecting layer are disposed in a region where the conductive metal pattern layer is provided, and the conductive metal pattern layer is disposed closer to the transparent film base than the transparent conductive layer and the protecting layer, the protecting layer is selected from the group consisting of a precious metal and a metal oxide, and the transparent conductive layer is disposed at an opening section where the conductive metal pattern layer is absent.

2. The transparent electrode film according to claim 1, wherein the conductive metal pattern layer has a stacked-layer configuration including: a metal adhesive layer disposed in contact with the transparent film base; and a metal thin-film layer disposed on top of the metal adhesive layer.

3. The transparent electrode film according to claim 1, wherein the protecting layer has a thickness of 1 to 50 nm.

4. The transparent electrode film according to claim 1, wherein an oxidation-reduction potential of the protecting layer is higher than an oxidation-reduction potential of the conductive metal pattern layer.

5. The transparent electrode film according to claim 1, wherein the protecting layer is an oxide layer having a relative dielectric constant of 10 or more.

6. The transparent electrode film according to claim 1, wherein the protecting layer includes titanium oxide.

7. The transparent electrode film according to claim 1, wherein the protecting layer is an oxide film of a metal that constitutes the conductive metal pattern layer.

8. The transparent electrode film according to claim 1, wherein the protecting layer includes gold or silver.

9. The transparent electrode film according to claim 1, wherein the protecting layer is also disposed at the opening section where the conductive metal pattern layer is absent.

10. The transparent electrode film according to claim 1, wherein
in the region where the conductive metal pattern layer is provided, a coupling agent layer, the protecting layer and the transparent conductive layer are sequentially disposed on top of the conductive metal pattern layer, and
the coupling agent layer and the protecting layer are not disposed at the opening section where the conductive metal pattern layer is absent.

11. The transparent electrode film according to claim 10, wherein the coupling agent layer includes cured product of a silane coupling agent.

12. The transparent electrode film according to claim 11, wherein the silane coupling agent includes at least one selected from the group consisting of a silane coupling agent containing an amino group and a silane coupling agent containing an acid anhydride group.

13. A dimming element comprising: a pair of transparent electrode substrates; and a dimming layer sandwiched between the pair of transparent electrode substrates, wherein
at least one of the pair of transparent electrode substrates is a transparent electrode film comprising a transparent film base and a transparent electrode disposed on the transparent film base,
the transparent electrode including a transparent conductive layer, a protecting layer and a conductive metal pattern layer,
the conductive metal pattern layer being patterned in an in-plane direction of the transparent film base,
the transparent conductive layer and the protecting layer are disposed in a region where the conductive metal pattern layer is provided, and the conductive metal pattern layer is disposed closer to the transparent film base than the transparent conductive layer and the protecting layer,
the protecting layer is selected from the group consisting of a precious metal and a metal oxide, and
the transparent conductive layer is disposed at an opening section where the conductive metal pattern layer is absent.

14. A method for manufacturing a transparent electrode film,
the transparent electrode film includes a transparent film base, and a transparent electrode disposed on the transparent film base,
the transparent electrode includes a transparent conductive layer and a conductive metal pattern layer,
the method comprising the steps of:
forming on the transparent film base the conductive metal pattern layer patterned in an in-plane direction of the transparent film base;
forming a protecting layer including at least one selected from the group consisting of a precious metal and a metal oxide; and
forming the transparent conductive layer, wherein
the transparent conductive layer and the protecting layer are formed after formation of the conductive metal pattern layer, and
the transparent conductive layer is formed so as to cover the conductive metal pattern layer and to cover an opening section where the conductive metal pattern layer is absent.

15. The method for manufacturing a transparent electrode film according to claim 14, wherein
after the step of forming the conductive metal pattern layer, a coupling agent layer is formed so as to cover the conductive metal pattern layer and to cover the opening section where the conductive metal pattern layer is absent,
the step of forming the protecting layer; and the step of forming the transparent conductive layer are then sequentially carried out,
in the step of forming the protecting layer, the protecting layer is formed so as to cover the conductive metal pattern layer and to cover the opening section where the coupling agent layer is disposed,
the step of forming the transparent conductive layer is carried out after the coupling agent layer and the protecting layer disposed over the opening section are removed.

* * * * *